(12) United States Patent
Saito

(10) Patent No.: US 6,231,774 B1
(45) Date of Patent: May 15, 2001

(54) PLASMA PROCESSING METHOD

(75) Inventor: Susumu Saito, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/215,165

(22) Filed: Dec. 18, 1998

(30) Foreign Application Priority Data

Dec. 19, 1997 (JP) .................................................. 9-365222

(51) Int. Cl.$^7$ .................................................. G01N 21/00
(52) U.S. Cl. .................................................. 216/60; 438/9
(58) Field of Search .................................. 216/60; 438/9; 204/298.32, 298.03, 192.13, 192.33

(56) References Cited

U.S. PATENT DOCUMENTS

| | | |
|---|---|---|
| 5,290,383 | 3/1994 | Koshimizu . |
| 5,928,532 | * 7/1999 | Koshimizu et al. .................. 216/60 |

FOREIGN PATENT DOCUMENTS 4-338663   11/1992   (JP) .

* cited by examiner

*Primary Examiner*—Thi Dang
(74) *Attorney, Agent, or Firm*—Finnegan, Henderson, Farabow, Garrett & Dunner, L.L.P.

(57) ABSTRACT

Plasma P that is caused to fluctuate by a magnet 128 is generated inside a reaction chamber 102 of an etching apparatus 100. The signal of the fluctuating plasma light detected at a photosensor unit 136 via a detection window 134 is sampled over a constant sampling cycle with a arithmatic control unit 120 to obtain data strings. A plurality of hypothetical fluctuation cycles are hypothesized and the step for calculating the moving average values during the individual hypothetical fluctuation cycles using the data strings is repeated, then arithmetic processing is performed on the moving average values calculated for the individual repetition timings to create moving average value data for each of the hypothetical fluctuation cycles to ascertain approximate expressions corresponding to the individual hypothetical fluctuation cycles. In addition, deviation quantities between data strings of the individual moving average values and the corresponding approximate expressions during a given period are calculated, and the hypothetical fluctuation cycle corresponding to the smallest deviation quantity is determined as the fluctuation cycle of the plasma P. Based upon the fluctuation cycle thus determined, the data string of the moving average value is ascertained from the data strings of the sampling signal to determine the endpoint for the processing.

13 Claims, 3 Drawing Sheets

PLASMA PROCESSING METHOD

BACKGROUND OF THE INVENTION

The present invention relates to a plasma processing method.

Plasma processing apparatuses constituted by employing various types of plasma sources have been proposed in the area of semiconductor manufacturing apparatuses in the prior art. They include a plasma processing apparatus that is capable of performing plasma processing on an object such as a substrate by forming an electric field between an upper electrode and a lower electrode provided facing opposite each other within a processing chamber and by generating plasma from a processing gas introduced into the processing chamber with the electric field.

The plasma processing apparatuses above also include the so-called magnetic field assist type plasma processing apparatus which is provided with a magnet capable of forming a rotating magnetic field within the processing chamber. By adopting this structure, the electrons within the plasma can be trapped by the magnetic field formed inside the processing chamber so that the number of times they collide with the processing gas particles can be increased, thereby exciting a plasma of high density. In addition, by rotating the magnetic field, a high degree of uniformity in the density of the plasma can be achieved to realize uniformity, high speed plasma processing.

Now, it is crucial in a plasma processing process such as etching that the endpoint of the plasma processing be judged accurately to end the plasma processing with no delay. As a method for detecting the endpoint of plasma processing, a method in which any change in the light spectrum of a specific substance contained within the plasma in the processing chamber is detected, with the endpoint being detected based upon such change, has been proposed in the prior art. This method, which is conceived from the observation that the contents in the plasma change as the etching on the substrate progresses, aims to detect a real-time endpoint of the etching process accurately by monitoring change in the intensity of the light spectrum of a specific substance.

However, in the magnetic field assist type plasma processing apparatus described above, areas with varying degrees of density are formed within the plasma in correspondence to the direction of the magnetic field formed inside the processing chamber. Then, as the magnetic field rotates, the density distribution of the plasma also fluctuates. Consequently, it is necessary to take into consideration fluctuations of the plasma resulting from the rotation of the magnetic field when performing fixed-point observation of the plasma light through, for instance, a detection window provided at a wall of the processing chamber.

Accordingly, Japanese Unexamined Patent Publication No. H04 (1992)-338663, teaches for instance, a technology for achieving accurate endpoint detection by providing a rotary encoder that generates pulses in synchronization with the rotation of the magnet in an etching apparatus, sampling the plasma light in response to the pulses and removing the noise component brought by the rotation cycle of the magnet.

However, in a structure in which the plasma light is sampled in correspondence to the rotation cycle of the magnet, which is determined in hardware as described above, a device such as a rotary encoder must be added to the processing apparatus, resulting in a complicated apparatus configuration, and also in an increase in the initial cost of the apparatus.

In addition, in a structure in which the plasma light is sampled in correspondence to the rotation cycle of the magnet, which is determined in hardware as described above, the sampling cycle varies every time processing is performed. Moreover, in some cases, more efficient processing may be achieved by employing a fixed cycle as a sampling cycle in signal processing software for endpoint detection, and in other cases, a fixed cycle is absolutely required. Thus, there is a problem with the structure described above in that such requirements on the software side cannot be supported with a high degree of flexibility.

SUMMARY OF THE INVENTION

An object of the present invention, which has been completed by addressing the problems of the plasma processing methods in the prior art discussed above, is to provide a new and improved plasma processing method with which the fluctuation cycle of the plasma that fluctuates in each processing, i.e., the rotation cycle of the magnet, can be accurately ascertained through software by sampling the plasma light within the processing chamber over a constant cycle without having to modify the structure of the hardware in the prior art.

Another object of the present invention is to provide a new and improved plasma processing method that is capable of obtaining a more accurate moving average value with relatively little calculation emulating a high sampling quantity without increasing the actual quantity of sampling performed, by creating a pseudo sampling signal having a relatively narrow sampling interval from a sampling signal having relatively wide sampling interval.

In order to achieve the objects described above, in a first aspect of the present invention, a plasma processing method for performing plasma processing on an object placed inside a vacuum chamber by forming an electric field within the vacuum chamber into which a processing gas is introduced and generating plasma that fluctuates over a given fluctuation cycle, which, in order to determine the fluctuation cycle of the plasma, includes:

(a) a step for obtaining sampling data by sampling plasma light of the plasma with a constant sampling cycle;

(b) a step for hypothesizing a plurality of hypothetical fluctuation cycle, calculating a moving average value over each period corresponding to each of the hypothetical fluctuation cycles based upon the sampling data and obtaining a moving average value data for each of the hypothetical fluctuation cycles;

(c) a step for obtaining an approximate expression corresponding to each of the hypothetical fluctuation cycles based upon the moving average value data for each of the hypothetical fluctuation cycles;

(d) a step for ascertaining a quantity of deviation between the moving average value data and the corresponding approximate expression for each of the hypothetical fluctuation cycles at one or two or more time points; and (e) a step for ascertaining the hypothetical fluctuation cycle having the smallest quantity of deviation among the quantities of deviation to determine the hypothetical fluctuation cycle as the fluctuation cycle of the plasma, is provided.

In addition, in order to ascertain the endpoint of plasma processing based upon the fluctuation cycle of the plasma thus determined;

(f) a step for calculating moving average value data for the period corresponding to the fluctuation cycle of the plasma ascertained in step (e) by using the sampling data; and (g) a step for determining the endpoint of the plasma processing based upon the moving average value data calculated in step (f) are implemented.

This structure makes it possible to calculate a fluctuation cycle of the plasma that may vary for different processing simply through arithmetic calculation processing in software even when the plasma light is sampled over a constant sampling cycle. Consequently, a fluctuation cycle of plasma can be ascertained with a high degree of accuracy for each processing without having to add a special hardware device.

In addition, in order to achieve the objects described above, in a second aspect of the present invention, in a plasma processing method for performing plasma processing on an object placed inside a reaction chamber by forming an electric field within the reaction chamber into which a processing gas is intoroduced and generating plasma that fluctuates over a given fluctuation cycle, (a) a step for obtaining sampling data by sampling plasma light of the plasma with a constant sampling period, with said fluctuation cycle not restricted to be an integer multiple of said sampling cycle;
(b) a step for calculating a moving average value for the fluctuation cycle using the sampling data; and
(c) a step for determining the endpoint for the plasma processing based upon change in the moving average value, are implemented in order to determine the endpoint of the processing.

By adopting this structure, it becomes possible to accurately ascertain the endpoint of the plasma processing while compensating for the fluctuation of the fluctuation cycle of the plasma that varies for each processing, through a processing implemented in software without having to add a special hardware device.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

In the drawings.

DETAILED DESCRIPTION OF THE PREFERRED EMBODIMENTS

The following is a detailed explanation of the preferred embodiments of the plasma processing method according to the present invention adopted in a method for endpoint determining in etching processing, in reference to the attached drawings.

Figure 1:
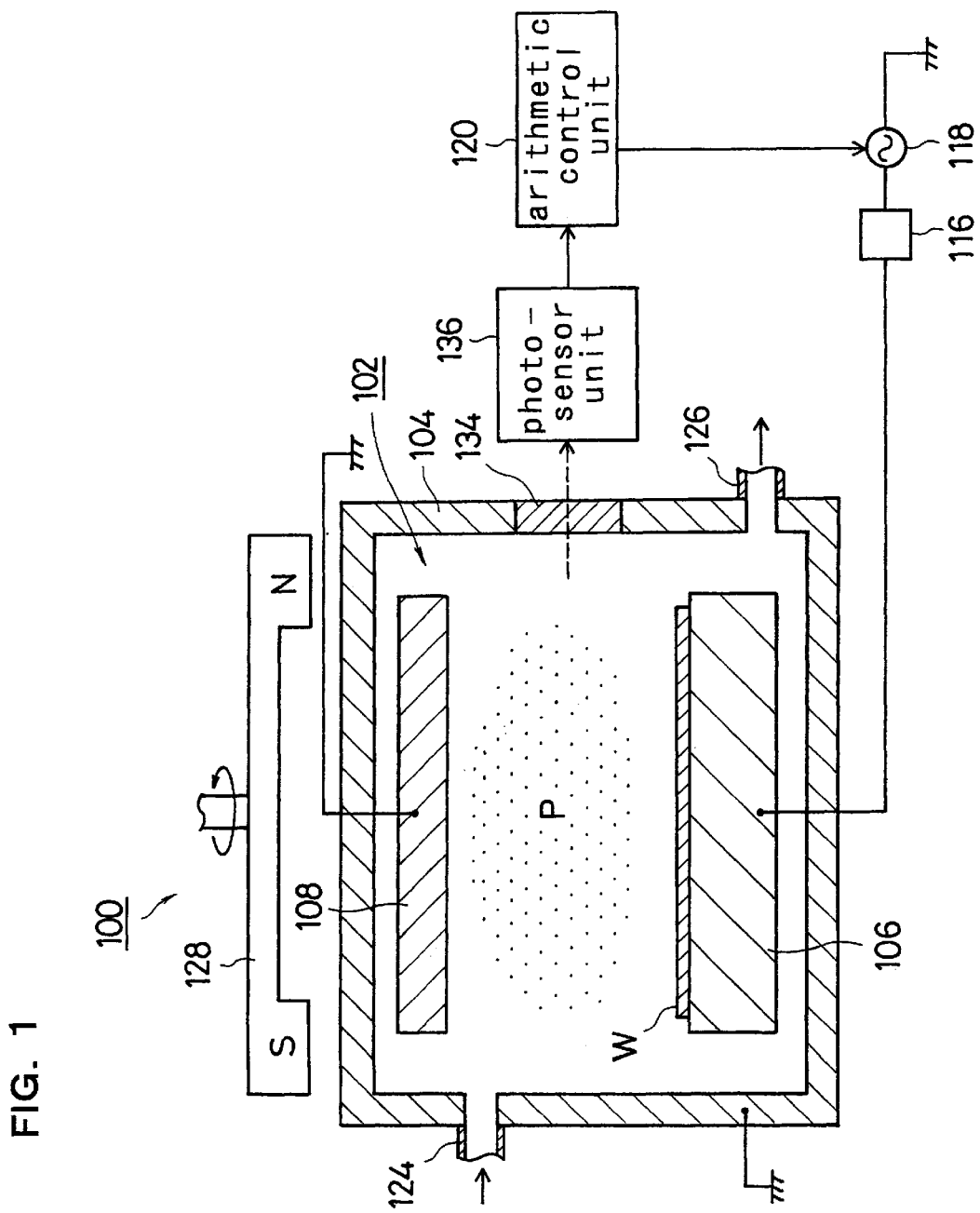
FIG. 1 is a schematic sectional view of an etching apparatus that may adopt the present invention.

First, the structure of an etching apparatus 100 that may adopt this method for endpoint determining is explained in reference to FIG. 1.

A reaction chamber 102 of the etching apparatus 100 is formed inside an electrically-conductive vacuum container 104. Inside the reaction chamber 102, a conductive lower electrode 106 that constitutes a susceptor and a conductive upper electrode 108 that is grounded are provided facing opposite each other. During the processing, an object, e.g., a substrate such as a semiconductor wafer (hereafter referred to as a "wafer") W may be placed and secured on the lower electrode 106. In addition, a RF power supply 118 is connected to the lower electrode 106 via a matching device 116, and RF power may be applied during the processing in response to a control signal provided by a arithmetic control unit 120.

In addition, a gas supply piping 124 for supplying a specific processing gas into the reaction chamber 102 and a exhaust piping 126 for exhausting the atmosphere within the reaction chamber 102 are connected to the vacuum container 104. Furthermore, a magnet 128 such as a permanent magnet that is capable of forming a specific rotating magnetic field within the reaction chamber 102 is provided above the vacuum container 104.

Moreover, a detection window 134 is formed at a side wall of the reaction chamber 102 and plasma light that has been transmitted through the detection window 134 is detected by a photosensor unit 136. The photosensor unit 136 is provided with a spectrometer (not shown) which disperses only the emission spectrum related to a specific substance from the plasma light, a photoelectric converter (not shown) that detects the emission intensity of the emission spectrum, an A/D converter that converts an analog signal that has been detected to a digital signal and the like. The data that have been sampled at the photosensor unit 136 are output to the arithmatic control unit 120 as necessary. It is to be noted that while a structure is adopted in the example in the figure in which the plasma light is directly detected by the photosensor unit 136, a structure provided with a means for light communication such as an optical fiber between the detection window 134 and the photosensor unit 136 may be assumed, instead.

Next, etching processing performed on the wafer W in the etching apparatus 100 is explained. First, the wafer W is placed on the lower electrode 106, the processing gas is introduced into the reaction chamber 102 through the gas supply piping 124 and the atmosphere within the reaction chamber 102 is exhausted through the exhaust piping 126 to maintain the atmosphere inside the reaction chamber 102 at a specific reduced pressure. Next, the magnet 128 above the vacuum container 104 is rotated at a specific rotation rate to form a rotating magnetic field inside the reaction chamber 102.

When RF power is subsequently applied to the lower electrode 106 from the RF power supply 118, the processing gas is caused to dissociate by the electric field formed inside the reaction chamber 102 to generate plasma P having a high degree of density, and the plasma etching processing is performed on the wafer W. In addition, the plasma P is caused to fluctuate over a specific rotation cycle by the rotating magnetic field formed inside the reaction chamber 102 so that the ununiformity in the density is evened out to achieve uniform processing to be performed on the wafer W.

Next, the method for endpoint determining of etching processing in this embodiment that is adopted in the etching apparatus 100 described above is explained in reference to FIGS. 2–5. This method for endpoint determining comprises a step for plasma fluctuation cycle determining and a step for etching processing endpoint determining.

In the fluctuation cycle determining step, the fluctuation cycle of the magnetic field that changes as the magnet 128 rotates, i.e., the fluctuation cycle of the plasma, is determined. In the endpoint determining step, accurate endpoint determining is implemented after removing the noise component in the sampling signal generated as a result of the fluctuation of the plasma based upon the plasma fluctuation cycle that has been ascertained.

Now, the fluctuation cycle determining step (A) and the endpoint determining step (B) are individually explained below.

(A) Fluctuation Cycle Determining Step

Figure 2:
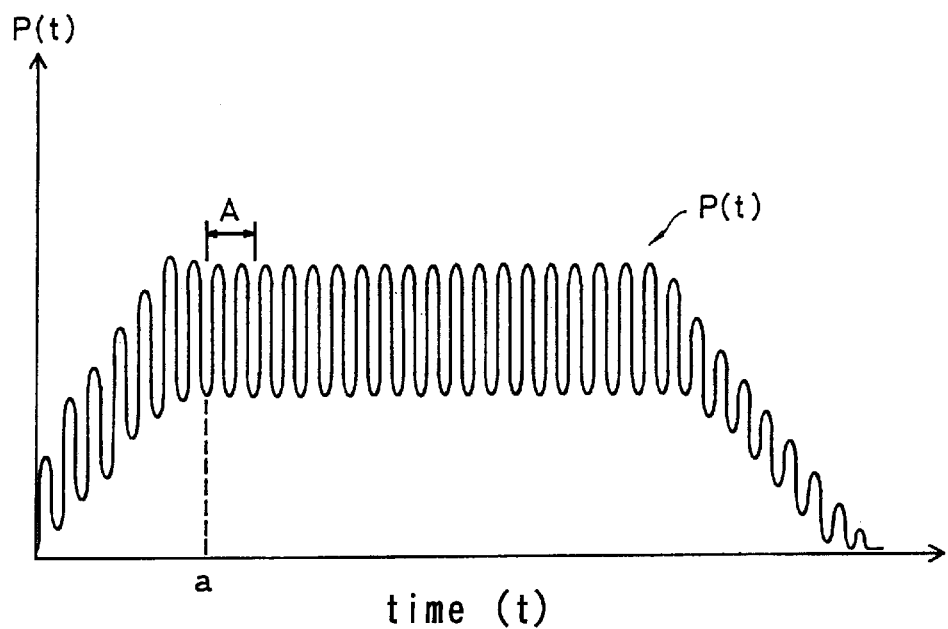
FIG. 2 is a schematic illustration of a rotation cycle determining step to be adopted in the etching apparatus shown in FIG. 1.
Figure 3:
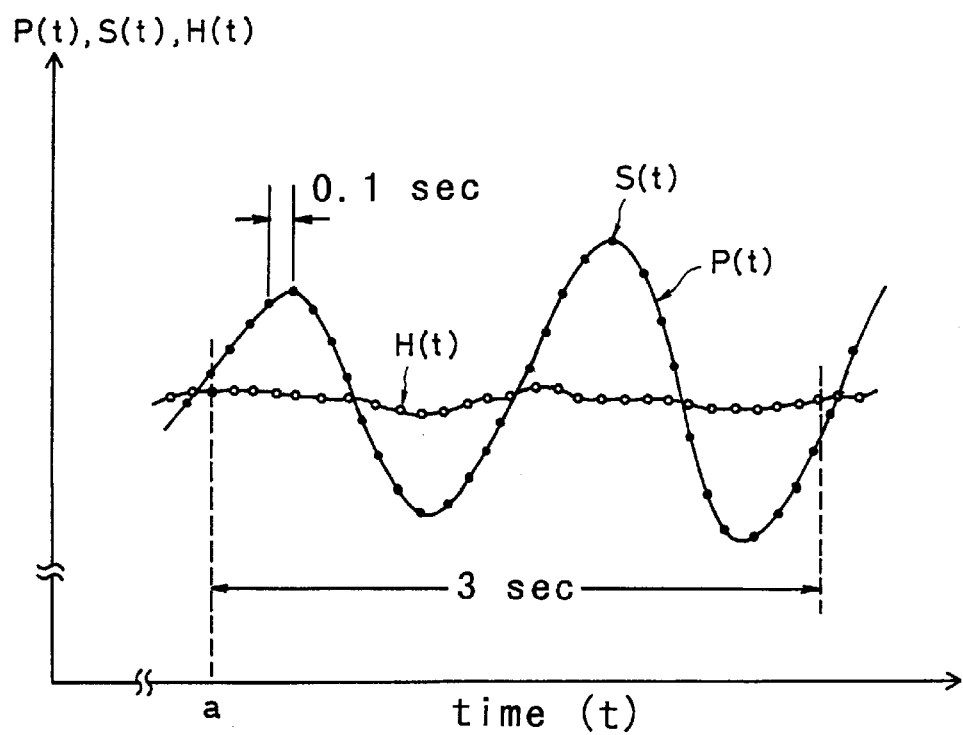
FIG. 3 is a schematic illustration of a rotation cycle determining step to be adopted in the etching apparatus shown in FIG. 1.
Figure 4:
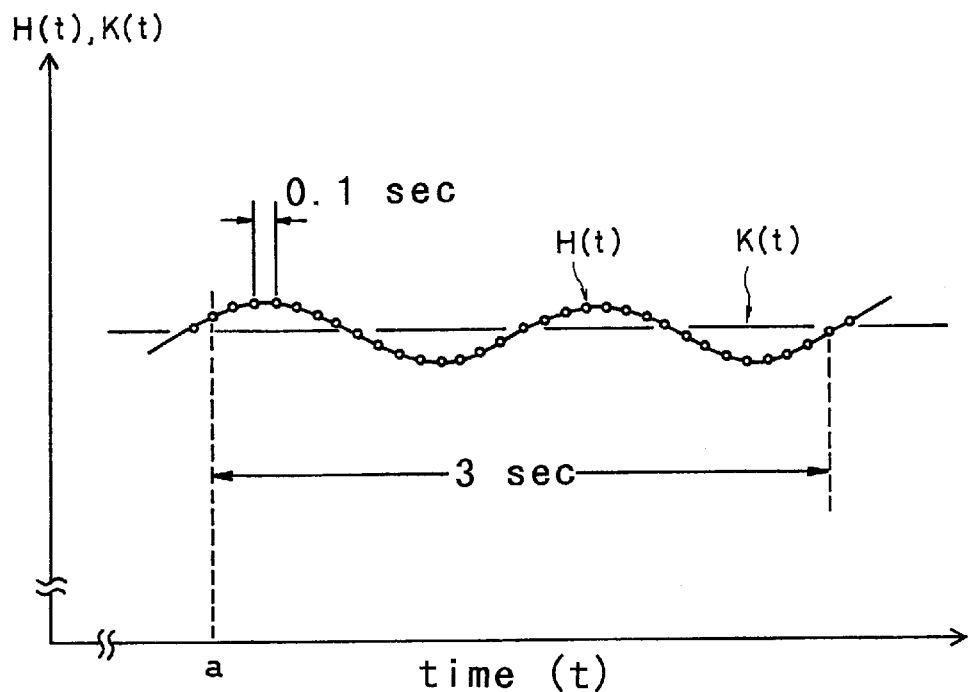
FIG. 4 is a schematic illustration of a rotation cycle determining step to be adopted in the etching apparatus shown in FIG. 1.

First, the fluctuation cycle determining step is explained in reference to FIGS. 2–4. In FIG. 2, the change that the sampling signal P(t) undergoes over time, which is sampled at the photosensor unit 136 of the etching apparatus 100, is illustrated. As shown in the figure, while the sampling signal shifts in an unstable manner during the rise of the plasma, the sampling signal stabilizes as the plasma becomes stable. Thus, the fluctuation cycle of the plasma is ascertained based upon the sampling signal during a period A after the sampling signal becomes stable (following the time point "a" in the example in the figure).

FIG. 3 illustrates in an enlargement, the transition of the sampling signal during the period A in FIG. 2. It is assumed that sampling is performed over 0.1 sec intervals in the example in the figures. Since the fluctuation cycle of the magnetic field inside the reaction chamber 102 roughly interlocks with the rotation cycle of the magnet 128, its approximate cycle can be globally deduced. For instance, it can be deduced that in the embodiment, the plasma fluctuates over a 3.0–3.1 sec cycle in correspondence to the rotation cycle of the magnet 128.

Consequently, if the accurate fluctuation cycle of the plasma, which is deduced to be within the range of a 3.0–3.1 sec cycle, is to be ascertained with a higher degree of accuracy, e.g., in the order of 0.01 sec, sampling must be performed over 0.01 sec intervals in the prior art. However, simply shortening the sampling cycle presents a problem in that the quantity of sampling data increases excessively to require a greater length of time to be spent on data processing. By adopting the method in the embodiment, it becomes possible to ascertain the fluctuation cycle of the plasma through sampling performed over 0.1 sec intervals with a degree of accuracy equivalent to that achieved when sampling is performed over 0.01 sec intervals or even shorter intervals. The following is a detailed explanation of the method.

First, if we assume that the plasma is fluctuating over a 3.0 sec cycle, then, as in the method employed in the prior art, a moving average value $H_{3.00}(t)$ of sampling data is calculated using formula (1) below in order to remove the noise component contained in the sampling data. In this case, the moving average calculation period relative to the 3.0 see hypothetical fluctuation cycle is 3.0 sec.

$$H_{3.00}(t)=(S(t\text{-}2.9)+S(t\text{-}2.8)+S(t\text{-}2.7)+\ldots+S(t\text{-}0.1)+S(t))/30 \quad (1)$$

Next, if we assume that the plasma is fluctuating over a 3.1 sec cycle, then, as in the preceding processing, the moving average value $H_{3.10}(t)$ of the sampling data is calculated based upon formula (2) below in order to remove the noise component contained in the sampling data. In this case, the moving average calculation period relative to the 3.1 sec hypothetical fluctuation cycle is 3.1 sec.

$$H_{3.10}(t)=(S(t\text{-}3.0)+S(t\text{-}2.9)+S(t\text{-}2.8)+S(t\text{-}2.7)+\ldots+S(t\text{-}0.1)+S(t))/31 \quad (2)$$

In the example presented above, the hypothetical fluctuation cycle relative to a 0.1 sec sampling cycle is an integer multiple of the sampling cycle i.e., 3.0 sec or 3.1 sec. However, the actual plasma fluctuation cycle may not always be an integer multiple of the sampling cycle. For instance, if the actual plasma fluctuation cycle is 3.03 sec, its moving averaging calculation period is 3.03 sec. Consequently, measurement is not possible over a 0.1 sec sampling cycle, and if a moving average is to be ascertained, it is necessary to perform sampling over a sampling cycle in units of 0.01 sec. However, if the sampling cycle is set so narrow in this manner, the data quantity increases excessively, and a higher degree of efficiency in processing cannot be achieved.

In contrast, in the embodiment, by following the procedure described below, data sampled over 0.1 sec sampling cycle are used to generate pseudo data that will appear to have been sampled over a 0.01 sec sampling cycle, to enable moving averaging corresponding to the actual plasma cycle fluctuation.

For instance, the moving average value $H_{3.03}(t)$ at a point in time t when the plasma is assumed to be fluctuating over a 3.03 second cycle may be calculated by using formula (3) expressed as:

$$H_{3.03}(t)=\{(S(t\text{-}2.9)+S(t\text{-}2.8)+S(t\text{-}2.7)+\ldots+S(t\text{-}0.1)+S(t))*10+S(t\text{-}2.9\text{-}0.01)+S(t\text{-}2.9\text{-}0.02)+S(t\text{-}2.9\text{-}0.03)\}/303 \quad (3)$$

It is to be noted that since the data expressed as S(t-2.9-0.01), S(t-2.9-002) and S(t-2.9-0.03) in formula (3) are not data that are actually sampled but are data achieved by creating pseudo data in software through arithmetic processing using actually sampled data, and therefore, they are referred to as pseudo sampling data in this specification. These pseudo sampling data may be obtained as corresponding values at pseudo sampling timing such as time point t-2.9-0.01, the time point t-2.9-0.02, time point t-2.9-0.03 and the like on a straight line or an approximation curve connecting data indicated by adjacent sampling signals. In this specification, the time intervals assumed in order to obtain pseudo sampling data in this manner are referred to as pseudo sampling timing.

In addition, the approximation curve connecting the data of the adjacent sampling signals may be determined based upon data corresponding to a plurality of points by employing any of various statistical methods including a method of approximation using a polynomial of degree 1 or higher through the method of least squares, the Lagrange's interpolation and the spline interpolation.

Furthermore, if the data of the adjacent sampling signals are connected with a straight line, the S(t-2.9-0.01) above may be calculated through formula (4) expressed as:

$$S(t\text{-}2.9\text{-}0.01)=S(t\text{-}2.9)+(S(t\text{-}3.0)\text{-}S(t\text{-}2.9))/10*1 \quad (4)$$

S(t-2.9-0.02) may be calculated through formula (5) expressed as:

$$S(t\text{-}2.9\text{-}0.02)=S(t\text{-}2.9)+(S(t\text{-}3.0)\text{-}S(t\text{-}2.9))/10*2 \quad (5)$$

and S(t-2.9-0.03) may be calculated through formula (6) expressed as:

$$S(t\text{-}2.9\text{-}0.03)=S(t\text{-}2.9)+(S(t\text{-}3.0)\text{-}S(t\text{-}2.9))/10*3 \quad (6)$$

As described above, in the fluctuation cycle determining step in this embodiment, the moving average value H(t) and the pseudo sampling data such as S(t-2.9-0.01) are calculated using formulae (1)–(3) and formulae (4)–(6) presented above. By adopting such a structure, even a moving average value during a period which is not an integer multiple of the sampling cycle, i.e., even a moving average value during a period which is shorter than the actual sampling cycle, can be obtained based upon a smaller quantity of sampling data.

For instance, if the rotation cycle of the magnet 128 is assumed to be 3.03 sec, as described earlier, the plasma fluctuation cycle can be determined in the order of 1/100 sec, from 10 sets of sampling data, i.e., S(t-2.9), ..., S(t). Thus, in this embodiment, moving average values corresponding to a total of 303 sets of data including the pseudo sampling data can be ultimately calculated through less arithmetic processing by adopting the weighted moving average method.

Through a similar method, the moving average H(t) at a time point t when the rotation cycle of the magnet 128 is assumed to be 3.01 sec–3.09 sec can be ascertained.

Namely, each time the plasma light signal is sampled over 0.1 sec intervals during the period A in FIG. 2, the moving average values corresponding to individual moving average value calculation periods, i.e., 3.00 sec, 3.01 sec, 3.02 sec, 3.03 sec, 3.04 sec, 3.05 sec, 3.06 sec, 3.07 sec, 3.08 sec, 3.09 sec and 3.10 sec, are calculated in parallel, i.e., calculated simultaneously. The individual moving average values, $H_{3.00}(t)$, $H_{3.01}(t)$, $H_{3.02}(t)$, $H_{3.03}(t)$, $H_{3.04}(t)$, $H_{3.05}(t)$, $H_{3.06}(t)$, $H_{3.07}(t)$, $H_{3.08}(t)$, $H_{3.09}(t)$ and $H_{3.10}(t)$ are obtained in this manner.

Furthermore, by executing sampling over a plurality of times, data strings of the individual moving average values $H_{3.00}(t)$–$H_{3.10}(t)$ corresponding to the individual sampling time points can be obtained. In FIG. 3, $H_{3.03}(t)$ among these moving average values is plotted over a given period of time as H(t) as an example.

While the explanation has been given above on a method for obtaining a moving average value at a degree of accuracy that is 10 times that of the actual sampling cycle, the structure of the embodiment is not limited to that in the example. For instance, the moving average values may be obtained at a degree of accuracy which is 100 times that of the actual sampling cycle. Namely, the moving average value $H_{3.031}(t)$ at a point in time t when the plasma fluctuation cycle is assumed to be 3.031 sec may be calculated through formula (7) expressed as:

$$H_{3.031}(t)=\{(S(t\text{-}2.9)+S(t\text{-}2.8)+S(t\text{-}2.7)+ \ldots +$$
$$S(t\text{-}0.1)+S(t))*100+(S(t\text{-}2.9\text{-}0.01)+S(t\text{-}2.9\text{-}0.02)+$$
$$S(t\text{-}2.9\text{-}0.03))*10+S(t\text{-}2.9\text{-}0.03\text{-}0.001)\}/3031 \quad (7)$$

In addition, S(t-2.9-0.01), S(t-2.9-0.02) and S(t-2.9-0.03) in formula (7) can be calculated through the corresponding formulae (4), (5) and (6) respectively. Furthermore, S(t-2.9-0.03-0.001) in the formula above may be calculated through formula (8) expressed as:

$$S(t\text{-}2.9\text{-}0.03\text{-}0.00)=S(t\text{-}2.9)+(S(t\text{-}3.0)-S(t\text{-}2.9))/100*31 \quad (8)$$

Next, in reference to FIG. 4, a step for obtaining approximate expressions, e.g., approximate expression of degree 1, from data strings of the individual moving average values that have been obtained for the required number through the steps described above is explained. FIG. 4 presents an enlargement of H(t) in FIG. 3. In addition, K(t) in FIG. 4 represents an approximate expression of degree 1 obtained using the values of H(t) over a specific period through, for instance, the method of least squares.

In this embodiment, since it is already known that the plasma fluctuation cycle, i.e., the rotation cycle of the magnet 128, is within the range of 3.0 sec–3.1 sec, the specific period is set at 3.1 sec. Then, approximate expressions of degree 1 corresponding to the individual data strings of $H_{3.00}(t)$–$H_{3.10}(t)$ described earlier are obtained, to be referred to as $K_{3.00}(t)$–$K_{3.10}(t)$ in correspondence to the individual data strings.

Next, step for calculating an average of absolute values of quantities of deviation between data strings of individual moving average values calculated through the steps described above and the approximate expression of degree 1 corresponding to the data string of the moving average values is explained. The average A of the absolute values of such quantities of deviation may be calculated through formula (9) expressed as:

$$A=\{|H(t\text{-}3.0)-K(t\text{-}3.0)|+|H(t\text{-}2.9)-K(t\text{-}2.9)|+|H(t\text{-}2.8)-K(t\text{-}2.8)|+ \ldots$$
$$+|H(t\text{-}0.1)-K(t\text{-}0.1)|+|H(t)-K(t)|\}/31 \quad (9)$$

It is to be noted that the time point t in formula (9) represents a time point which is different from the time point t in formulae (1)–(8) that are used to obtain the moving average values described earlier.

Through formula (9) presented above, the absolute values of quantities of deviation can be ascertained as long as the period over which the moving average values are obtained, i.e., the rotation cycle of the magnet 128 that may be assumed, is within the range of 3.00 sec–3.10 sec.

It is to be noted that in order to improve the accuracy with which the fluctuation cycle is ascertained, it is desirable to compare the deviation quantities between the data strings of said moving average values and said approximate expressions over a period extending, at least as long as or longer than the maximum fluctuation cycle that can be assumed.

The averages of the absolute values of deviation quantities are obtained in correspondence to the data strings of the moving average values $H_{3.00}(t)$–$H_{3.10}(t)$ and in correspondence to the approximate expressions of degree 1, $K_{3.00}(t)$–$K_{3.10}(t)$, corresponding to the individual data strings, to be referred to as $A_{3.00}$–$A_{3.10}$ respectively.

It is to be noted that the formula to be used to obtain the averages A of the absolute values of the deviation quantities is not restricted to formula (9) presented above as long as it indicates the degree of displacement between the data strings $H_{3.00}(t)$–$H_{3.10}(t)$ and $K_{3.00}(t)$–$K_{3.10}(t)$. In addition, the time points at which the total averages A are obtained are not required to be the same for all of $A_{3.00}$–$A_{3.10}$ as explained above, and $A_{3.03}$, for instance, may be ascertained using the data values at time points t-2.9, t-2.8, t-2.7, ..., t-0.1, t, t-2.9-0.01, t-2.9-0.02 and t-2.9-0.03, i.e., the data values at the time points at which the moving average values are calculated.

Next, a step for calculating the plasma fluctuation cycle, i.e., the rotation cycle of the magnet 128 using the averages of the absolute values of the deviation quantities obtained through the step described above is explained. The smallest value among the averages $A_{3.00}$–$A_{3.10}$ of the absolute values of the deviation quantities calculated through formula (9) is searched, and a hypothetical fluctuation cycle relative to the value is designated as an actual plasma fluctuation cycle T. Namely, if $A_{3.03}$ is the smallest value, the plasma fluctuation cycle T is the closest to 3.03 sec. This may be substantiated by the following.

Namely, during the period A in FIG. 2, the state of the plasma P inside the reaction chamber 102 is relatively stable, resulting in the original waveform based upon the plasma light that does not include the rotational fluctuation achieving a relatively smooth curve. In addition, since the calculation is performed over a very short period, the original waveform can be approximated with a straight line. Furthermore, if the period over which the moving average value is calculated matches the rotation cycle of the magnet 128 perfectly, the moving average values match the original waveform, which does not include the rotational fluctuation. Thus, since in case of the data string of the moving average value obtained during a period that is closest to the real fluctuation cycle, a displacement (deviation) between the data string and the approximate expression of degree 1 is smallest, the hypothetical fluctuation cycle having the minimum value among the averages of the absolute values of the deviation quantities is the closest to the real fluctuation cycle.

Through the fluctuation cycle determining step in the embodiment structured as described above, the fluctuation cycle of the plasma corresponding to the rotation cycle of the magnet 128 can be determined with a high degree of accuracy even when the fluctuating plasma light is sampled over a constant cycle. In addition, since the weighted moving average method is used in the calculation described above, specific moving average values required for determining the plasma fluctuation cycle can be obtained through relatively little arithmetic processing without having to increase the number of sets of sampling data.

(B) Endpoint Determining Step

Figure 5:
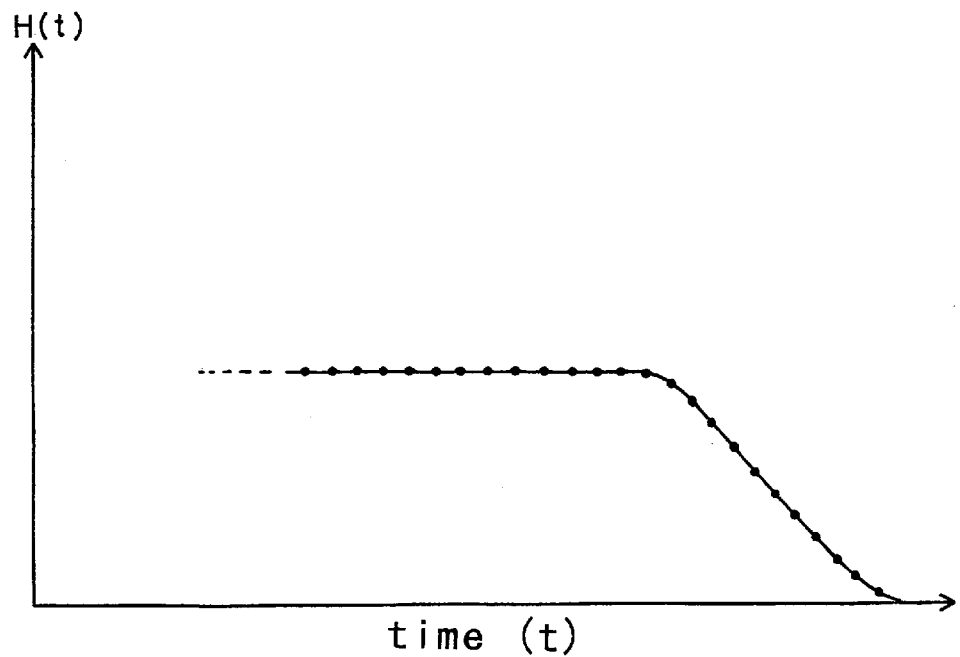
FIG. 5 is a schematic illustration of an endpoint determining step to be adopted in the etching apparatus shown in FIG. 1.

Next, in reference to FIG. 5, the endpoint determining step for plasma processing is explained. In this endpoint determining step, which follows the fluctuation cycle determining step described above in which the plasma fluctuation cycle is determined, the signal P(t) of the plasma light is sampled based upon the rotation cycle of the magnet 128, data strings are stored in memory by obtaining data corresponding to the moving average values from the sampling signal and changes that the data strings of the moving average values undergo are analyzed, for instance, in software to determine the endpoint for the etching processing.

FIG. 5 shows a data string of moving average values that may be calculated through formula (10) expressed as:

$$H(t)=\{(S(t-0.1*(m-1))+S(t-0.1*(m-2))+\ldots+S(t-0.1)+S(t))*10+ \\ S(t-0.1*(m-1)-0.01)+\ldots+S(t-0.1*(m-1)-0.01*n)\}/ \\ (10*m+n) \quad (10)$$

It is to be noted that formula (10) is similar to formula (3) explained earlier. In addition, m in formula (10) represents the quotient of (T/sampling cycle), n in formula (10) represents a value achieved by multiplying the remainder of (T/sampling cycle) by 10 and 0.1 indicates the sampling cycle.

The pseudo sampling data in formula (10), i.e., S(t-0.1* (m-1)-0.01)-S(t-0.1*(m-1)-0.01*n), may be calculated through formulae similar to formulae (4)–(6) presented earlier. Consequently, by performing calculation using formula (10), moving average values during periods that are not integer multiples of the sampling cycle can be obtained using a small number of sets of sampling data as explained in reference to formulae (4)–(6), and at the same time, the moving average values of a plurality of sets of data including the pseudo sampling data can be calculated through relatively little arithmetic processing. Furthermore, by weighting the sampling data for the pseudo sampling data when calculating said moving average values the endpoint determining can be implemented with an even higher degree of accuracy.

It is to be noted that the endpoint determining step for the etching processing is not restricted to be implemented in combination with the fluctuation cycle determining step described earlier. For instance, even when the rotation cycle of the magnet 128 is known in advance, if the rotation cycle is not an integer multiple of the sampling interval, moving average values may be calculated in a manner similar to that employed in the endpoint determining step explained earlier in reference to formula (10) to extract a plasma light signal which is not affected by the rotational fluctuation of the magnet 128. In addition, the determining on the endpoint of etching processing is implemented by employing a known method, e.g., by differentiating data strings of moving average values and deciding that the etching processing is to be at the endpoint when the differential value is equal to or greater than a specific value.

Since, through the endpoint determining step in the embodiment structured as described above, the endpoint of processing is determined by using the signal obtained from data strings of the moving average values calculated during the period corresponding to the rotation cycle of the magnet 128 that has been accurately determined during the rotation cycle determining step described above, the endpoint determining can be implemented with a high degree of accuracy so that the etching processing can be ended accurately with a high degree of reliability.

While the invention has been particularly shown and described with respect to a preferred embodiment thereof by referring to the attached drawings, the present invention is not limited to the example and it will be understood by those skilled in the art that various changes in form and detail may be made therein without departing from the spirit, scope and teaching of the invention.

For instance, while an explanation has been given in reference to the embodiment on a method for determining the fluctuation cycle of fluctuations of a signal of plasma light occurring when the magnet 128 constituted of a permanent magnet is caused to rotate, the present invention is not restricted to this structure, and may be adopted when an electromagnet is used in place of the permanent magnet or when the magnet is caused to engage in reciprocal movement instead of rotational movement. Furthermore, the present invention may be adopted when fluctuation occurs in the plasma even if a magnet is not used, e.g., when the position at which an electric field is applied on an electrode is sequentially and cyclically changed.

According to the present invention, since the fluctuation cycle of plasma that is fluctuating and the endpoint of the plasma processing can be accurately determined simply through arithmetic processing in software, it is not necessary to use a specific hardware for determining the endpoint of etching at the processing apparatus. As a result, the configuration of the processing apparatus can be simplified, and at the same time, the present invention can be implemented with ease on an existing apparatus. In addition, since, according to the present invention, the fluctuation cycle and the processing endpoint can be determined based upon the sampling signal sampled over a constant sampling cycle, the present invention may be adopted when it is preferable to use a fixed sampling cycle or when a fixed cycle must be used, for reasons related to the software in the apparatus.

What is claimed is:

1. A plasma processing method for performing plasma processing on an object placed inside a reaction chamber by forming an electric field within said reaction chamber into which a processing gas is introduced and generating plasma that fluctuates over a given fluctuation cycle, comprising:

(a) a step for obtaining sampling data by sampling plasma light of said plasma with a constant sampling period;

(b) a step for hypothesizing a plurality of hypothetical fluctuation cycle, calculating a moving average values over each period corresponding to each of the hypothetical fluctuation cycles based upon said sampling data and obtaining a moving average value data for each of said hypothetical fluctuation cycles;

(c) a step for obtaining an approximate expression corresponding to each of said hypothetical fluctuation cycles based upon said moving average value data for each of said hypothetical fluctuation cycles;

(d) a step for ascertaining a deviation quantity between said moving average value data and a corresponding approximate expression for each of said hypothetical fluctuation cycles at one or two or more time points; and (e) a step for ascertaining a hypothetical fluctuation cycle having the smallest deviation quantity among said deviation quantities to determine said hypothetical fluctuation cycle as said fluctuation cycle of said plasma.

2. A plasma processing method according to claim 1, further comprising:

(f) a step for calculating a moving average value using said sampling data for a period corresponding to said fluctuation cycle of said plasma obtained in step (e); and (g) a step for determining an endpoint for plasma processing based upon said moving average value data calculated in step (f).

3. A plasma processing method according to claim 1, wherein:

a maximum value of said hypothetical fluctuation cycle is an anticipated upper limit value of said fluctuation cycle and a minimum value of said hypothetical fluctuation cycles is an anticipated lower limit value of said fluctuation cycle.

4. A plasma processing method according to claim 1, wherein:

said hypothetical fluctuation cycles are integer multiples of said sampling cycle.

5. A plasma processing method according to claim 1, wherein:

said hypothetical fluctuation cycles are not integer multiples of said sampling cycle.

6. A plasma processing method according to claim 5, wherein:

in step (b), numerical processing is performed on said sampling data to obtain pseudo sampling data corresponding to said hypothetical fluctuation cycle and said moving average values are calculated based upon said sampling data and said pseudo sampling data.

7. A plasma processing method according to claim 6, wherein:

in step (b), weighting is implemented on said sampling data and said pseudo sampling data to calculate said moving average values.

8. A plasma processing method according to claim 1, wherein:

in step (e), deviation quantities between the moving average values and the corresponding approximate expressions over a period extending, at least anticipated maximum value of the fluctuation cycle, are obtained for each hypothetical fluctuation cycle.

9. A plasma processing method according to claim 1, wherein:

a rotating magnetic field that causes plasma to fluctuate with a given rotation cycle is formed within said vacuum container.

10. A plasma processing method for performing plasma processing on an object placed inside a reaction chamber by forming an electric field within said reaction chamber into which a processing gas is introduced and generating plasma that fluctuates over a given fluctuation cycle, comprising:

(a) a step for obtaining sampling data by sampling plasma light of said plasma with a constant sampling period, with said fluctuation cycle not restricted to be an integer multiple of said sampling cycle;

(b) a step for calculating moving average values for said fluctuation cycle based upon said sampling data; and (c) a step for determining an endpoint of plasma processing based upon change in said moving average values.

11. A plasma processing method according to claim 10, wherein:

in step (b), numerical processing is performed on said sampling data to obtain pseudo sampling data corresponding to said fluctuation cycle and said moving average values are calculated based upon said sampling data and said pseudo sampling data.

12. A plasma processing method according to claim 11, wherein:

in step (b), weighting is implemented on said sampling data and said pseudo sampling data to calculate said moving average values.

13. A plasma processing method according to claim 10, wherein:

a rotating magnetic field that causes plasma to fluctuate over a given rotation cycle is formed within said vacuum container.

* * * * *

UNITED STATES PATENT AND TRADEMARK OFFICE
CERTIFICATE OF CORRECTION

PATENT NO. : 6,231,774 B1
DATED : May 15, 2001
INVENTOR(S) : Susumu Saito

It is certified that error appears in the above-identified patent and that said Letters Patent is hereby corrected as shown below:

<u>Title page,</u>
Item [57], ABSTRACT, lines 5 and 6, "a arithmatic" should read -- an arithmetic --

Signed and Sealed this

Seventh Day of May, 2002

Attest:

Attesting Officer

JAMES E. ROGAN
*Director of the United States Patent and Trademark Office*